(12) United States Patent
Dong et al.

(10) Patent No.: US 12,262,605 B2
(45) Date of Patent: Mar. 25, 2025

(54) DISPLAY PANEL AND DISPLAY DEVICE

(71) Applicant: Wuhan China Star Optoelectronics Technology Co., Ltd., Wuhan (CN)

(72) Inventors: Shuya Dong, Wuhan (CN); Bo Liu, Wuhan (CN); Qiang Gong, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/613,509

(22) PCT Filed: Oct. 12, 2021

(86) PCT No.: PCT/CN2021/123357
§ 371 (c)(1),
(2) Date: Nov. 23, 2021

(87) PCT Pub. No.: WO2023/050474
PCT Pub. Date: Apr. 6, 2023

(65) Prior Publication Data
US 2024/0251610 A1    Jul. 25, 2024

(30) Foreign Application Priority Data

Sep. 30, 2021   (CN) .......................... 202111164181.8

(51) Int. Cl.
*H10K 59/131* (2023.01)
*H01L 23/00* (2006.01)
*H10K 59/90* (2023.01)

(52) U.S. Cl.
CPC ............ *H10K 59/131* (2023.02); *H01L 24/05* (2013.01); *H01L 24/06* (2013.01); *H01L 24/29* (2013.01);
(Continued)

(58) Field of Classification Search
CPC ...... H10K 59/131; H10K 59/90; H01L 24/05; H01L 24/06; H01L 24/29; H01L 24/32;
(Continued)

(56) References Cited

U.S. PATENT DOCUMENTS

2009/0231507 A1   9/2009  Oohira
2017/0256583 A1   9/2017  Choi et al.
2019/0165078 A1*  5/2019  Tsuruoka ............... H10K 50/82

FOREIGN PATENT DOCUMENTS

CN   107329297 A   11/2017
CN   107422551 A   12/2017
(Continued)

*Primary Examiner* — Robert G Bachner
(74) *Attorney, Agent, or Firm* — Nathan & Associates; Menachem Nathan

(57) ABSTRACT

The present disclosure provides a display panel and a display device. A distance from a surface of a first conductive adhesive layer close to a first pin, electrically connecting the first conductive pad and the first pin, to the substrate is different from a distance of a surface of a second conductive adhesive layer electrically connected to the second conductive pad and the second pin to the substrate, to compensate for a height difference caused by the partial warpage of the pins on the drive chip when binding a drive chip, so as to ensure that the drive chip can be well bonded to the display panel.

20 Claims, 9 Drawing Sheets

(52) U.S. Cl.
CPC .............. *H01L 24/32* (2013.01); *H10K 59/90* (2023.02); *H01L 2224/05022* (2013.01); *H01L 2224/05073* (2013.01); *H01L 2224/05124* (2013.01); *H01L 2224/05139* (2013.01); *H01L 2224/05147* (2013.01); *H01L 2224/05166* (2013.01); *H01L 2224/0518* (2013.01); *H01L 2224/05562* (2013.01); *H01L 2224/05571* (2013.01); *H01L 2224/05573* (2013.01); *H01L 2224/05688* (2013.01); *H01L 2224/06152* (2013.01); *H01L 2224/29017* (2013.01); *H01L 2224/29028* (2013.01); *H01L 2224/32145* (2013.01); *H01L 2924/0549* (2013.01); *H01L 2924/1426* (2013.01)

(58) Field of Classification Search
CPC . H01L 2224/05022; H01L 2224/05073; H01L 2224/05124; H01L 2224/05139; H01L 2224/05147; H01L 2224/05166; H01L 2224/0518; H01L 2224/05562; H01L 2224/05571; H01L 2224/05573; H01L 2224/05688; H01L 2224/06152; H01L 2224/29017; H01L 2224/29028; H01L 2224/32145; H01L 2924/0549; H01L 2924/1426; H01L 24/13; H01L 24/16; H01L 24/81; H01L 24/83; G02F 1/13452; G02F 1/13458

See application file for complete search history.

(56) References Cited

FOREIGN PATENT DOCUMENTS

| | | |
|---|---|---|
| CN | 107749239 A | 3/2018 |
| CN | 109036155 A | 12/2018 |
| CN | 111665658 A | 9/2020 |
| CN | 111681538 A | 9/2020 |
| CN | 111883039 A | 11/2020 |
| CN | 112037649 A | 12/2020 |
| CN | 114035388 A | 2/2022 |

\* cited by examiner

DISPLAY PANEL AND DISPLAY DEVICE

FIELD OF INVENTION

The present disclosure relates to a field of display technology, and particularly to a display panel and a display device.

BACKGROUND OF INVENTION

As shown in FIG. 1, it is a schematic plan view of a conventional display panel. The display panel 100 has a display area 100a. The display panel 100 includes a driver chip 200. The driver chip 200 is attached to one side of the display area 100a of the display panel 100. The driver chip 200 includes input pins 201, output pins 202, and redundant pins 203. The input pins 201 and the output pins 202 are configured for transmission of signals. The redundant pins 203 do not have input or output functions. The redundant pins 203 are only used to support a balance of the driver chip 200. The redundant pins 203 are disposed side by side in a local area of the driver chip 200 close to the display area 100a, and the input pins 201 and output pins 202 are disposed side by side on one side of the redundant pins 203 away from the display area 100a, and the input pins 201 are located on opposite sides of the output pins 202, the driver chip 200 shown in FIG. 1 will cause some of the input pins 201 far away from the redundant pins 203 to lift up and cannot be attached to the display panel 100, and this in turn causes performance of the display panel to decrease, or even not to work properly.

Therefore, it is necessary to propose a technical solution to solve the problem that some input pins far from the redundant pins are tilted and cannot be attached to the display panel, which causes the display panel to fail to work normally.

SUMMARY

The present disclosure provides a display panel and a display panel to simplify the circuit structure complexity of a display panel for multi-gray level display.

To solve the above technical problems, the technical solutions provided by the disclosure as follows. The display panel provided in present disclosure, display panel, wherein the display panel comprises a display area and a pad area, and the pad area is disposed on one side of the display area, the display panel comprising:
- a substrate comprising a bearing surface;
- a first conductive pad disposed on the bearing surface of the substrate, and the first conductive pad locating at the display area;
- a second conductive pad disposed on the bearing surface of the substrate, and the second conductive pad disposed at the pad area;
- a driving chip bonding to the pad area, and the driving chip comprising:
- a first pin being disposed corresponding to the first conductive pad; and
- a second pin being disposed corresponding to the second conductive pad;
- a first conductive adhesive layer located between the first conductive pad and the first pin and being electrically connected to the first conductive pad and the first pin; and
- a second conductive adhesive layer located between the second conductive pad and the second pin and being electrically connected to the second conductive pad and the second pin; wherein
- a distance from a surface of the first conductive adhesive layer close to the first pin to the substrate is different from a distance from a surface of the second conductive adhesive layer close to the second pin to the substrate.

The present disclosure further provides a display device, the display device includes the display panel described above.

Beneficial Effect

The present disclosure provides a display panel and a display device, a distance from the first conductive adhesive layer electrically connected with the first conductive pad and the first pin to the substrate is different from the distance of the second conductive adhesive layer electrically connected with the second conductive pad and the second pin to the substrate, to compensate for the height difference caused by the partial warpage of the pins on the drive chip when binding the drive chip, so as to ensure that the drive chip can be well attached to the display panel.

DESCRIPTION OF DRAWINGS

In order to explain embodiments or technical solutions in the prior art more clearly, the following will briefly introduce drawings involved in a following description of the embodiments or the prior art. Obviously, the drawings in the following description are merely inventions. Those of ordinary skill in the art can obtain other drawings based on these drawings without creative work.

REFERENCE SIGNS

Figure 1:
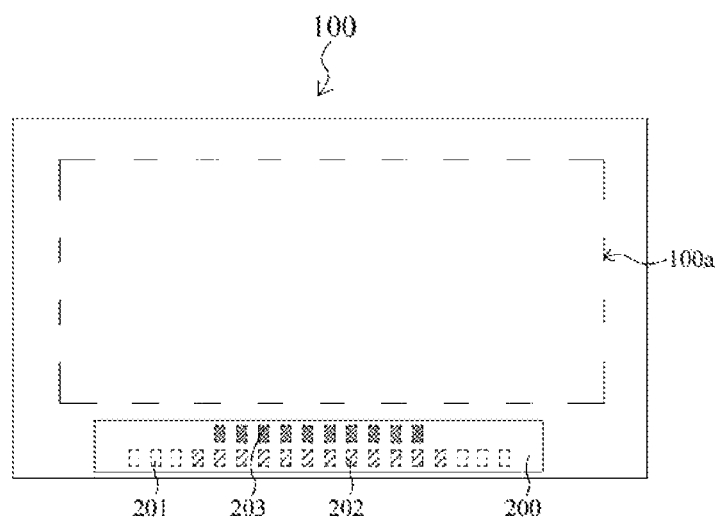
FIG. 1 is a schematic plan view of a display panel provided by a prior art.

300 display panel; 300*a* display area; 300*b* pad area; 300*b*2 blank area; 31 array substrate; 311 first conductive pad; 311*a* first bonding surface; 312 second conductive pad; 312*a* second bonding surface; 313 substrate; 313*a* bearing surface; 314 light-shielding layer; 3141 light-shielding pattern; 3142 light-shielding piece; 3143 first light-shielding member; 3144 second light-shielding member; 315 buffer layer; 316 semiconductor layer; 3161 active pattern; 3162 semiconductor member; 317 gate insulating layer; 318 first metal layer; 3181 gate; 3182 first metal member; 3183 second metal member; 3184 fifth metal member; 3185 sixth metal member; 3186 ninth metal member; 319 interlayer insulating layer; 319*a* third through hole 319*b* fourth through hole; 320 second metal layer; 3201 source electrode; 3202 drain electrode; 3203 third metal member; 3204 fourth metal member; 3205 seventh metal member; 3206 eighth metal member; 3207 tenth metal member 321 planarization layer; 321*a* first opening; 322 first transparent conductive layer; 323 passivation layer; 323*a* second opening; 323*b* third opening; 324 second transparent conductive layer; 3241 pixel electrode; 3242 first transparent conductive member; 3243 second transparent conductive member; 3244 third transparent conductive member; 3245 fourth transparent conductive member; 3246 fifth transparent conductive member; 325 conductive member; 326 third conductive pad; 326*a* third bonding surface; 327 redundant conductive pad; 327*a* redundant bonding surface; 328 fourth conductive pad; 328*a* fourth bonding surface; 329 fifth conductive pad; 329*a* fifth bonding surface; 33 driver chip; 330 base body; 331 first pin; 332 second pin; 333 third pin; 334 redundant pin; 335 fourth pin; 336 fifth pin; 330*a* first edge; 330*b* second edge; 34 flexible printed circuit board; 341 main body; 342 first binding part; 343 second binding part; 401 first conductive adhesive layer; 401*a* first surface; 402 second conductive adhesive layer; 402*a* second surface; 40*a* conductive particles.

DETAILED DESCRIPTION OF EMBODIMENTS

In order to make the purpose, technical solutions, and effects of this disclosure clearer and clearer, the following further describes this disclosure in detail with reference to the accompanying drawings and examples. It should be understood that the specific embodiments described here are only used to explain the present disclosure, and are not used to limit the present disclosure.

In view of the problem of the background technology, the inventor found that a main reason for a lifting of some pins on a driver chip is that the pins on the driver chip are unevenly distributed, a supporting force of the pins is unevenly distributed, and the uneven distribution of the supporting force causes some of the pins on the driving chip to be lifted and cannot be attached to pads of a display panel. In view of this, in this disclosure, the first conductive adhesive layer is electrically connected to the first conductive pads and the first pins, the second conductive adhesive layer is electrically connected to the second conductive pads and the second pins, a distance from the first conductive adhesive layer, close to the first pins, to the substrate is different from a distance from a surface of the second conductive adhesive layer, close to the second pins, to the substrate, so that the elevated pins on the driver chip are combined with either the conductive first conductive adhesive layer or the conductive second conductive adhesive layer, whichever has a larger distance to the substrate, so as to ensure that the pins of the driver chip is elevated upwards. The pins can thus be attached to the display panel normally. Wherein, the first conductive pad and the second conductive pad are both disposed on the bearing surface of the substrate, and both are located in the pad area.

Figure 2:
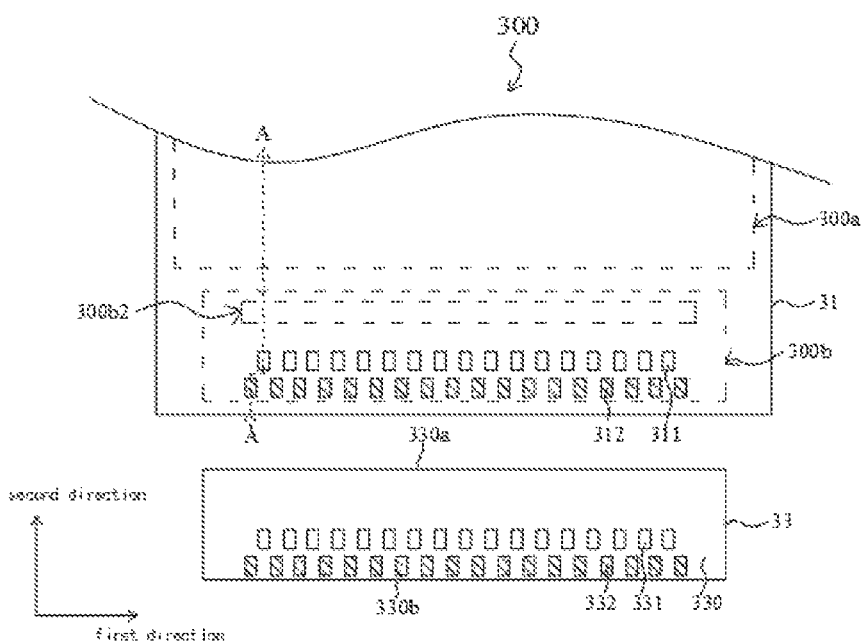
FIG. 2 is a schematic view of a display panel of a first embodiment of this disclosure.
Figure 3:
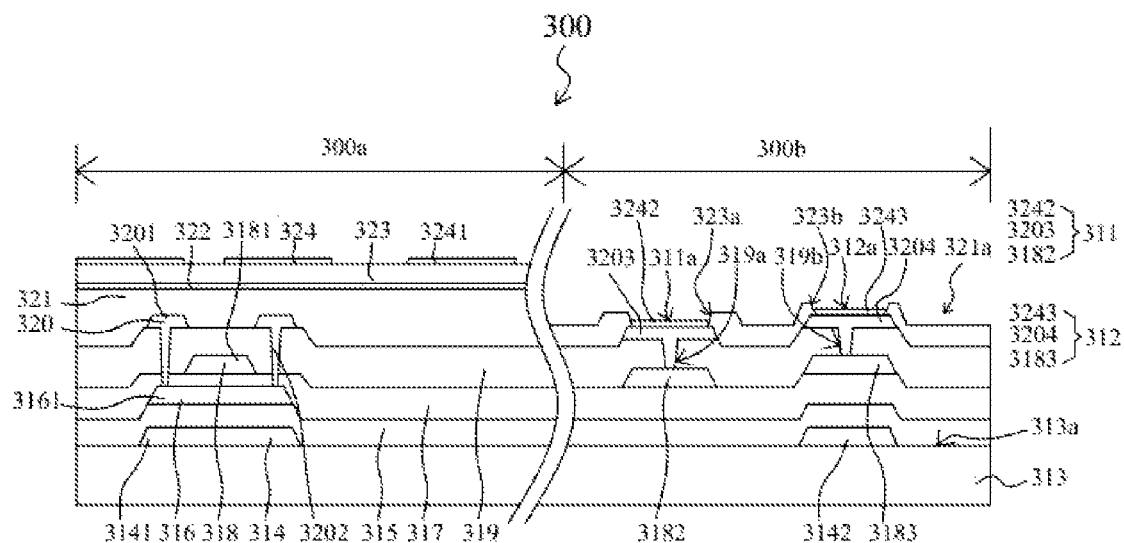
FIG. 3 is a first schematic cross-sectional view along an A-A line of the display panel as shown in FIG. 2.
Figure 4:
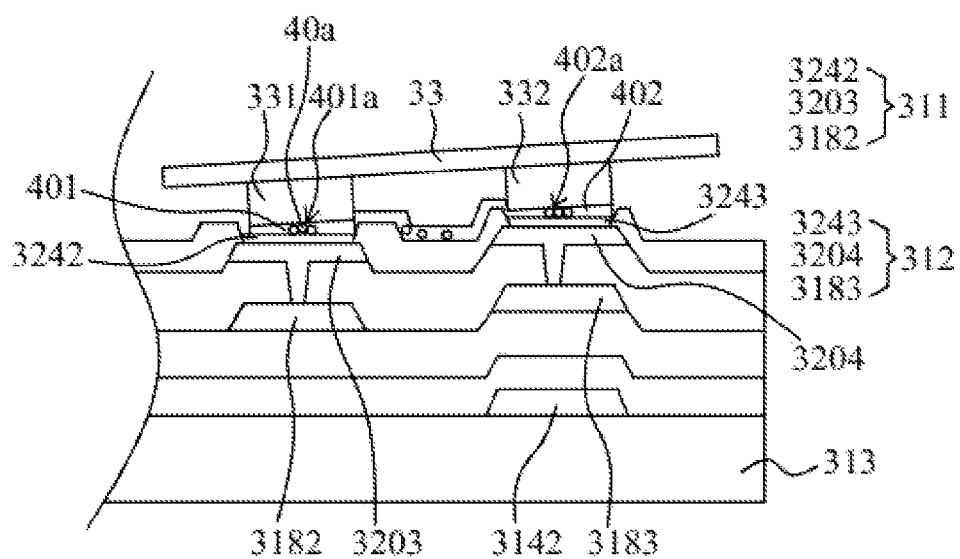
FIG. 4 is a schematic cross-sectional view of a driver chip shown in FIG. 2 attached to a first conductive pad and a second conductive pad shown in FIG. 3.
Figure 5:
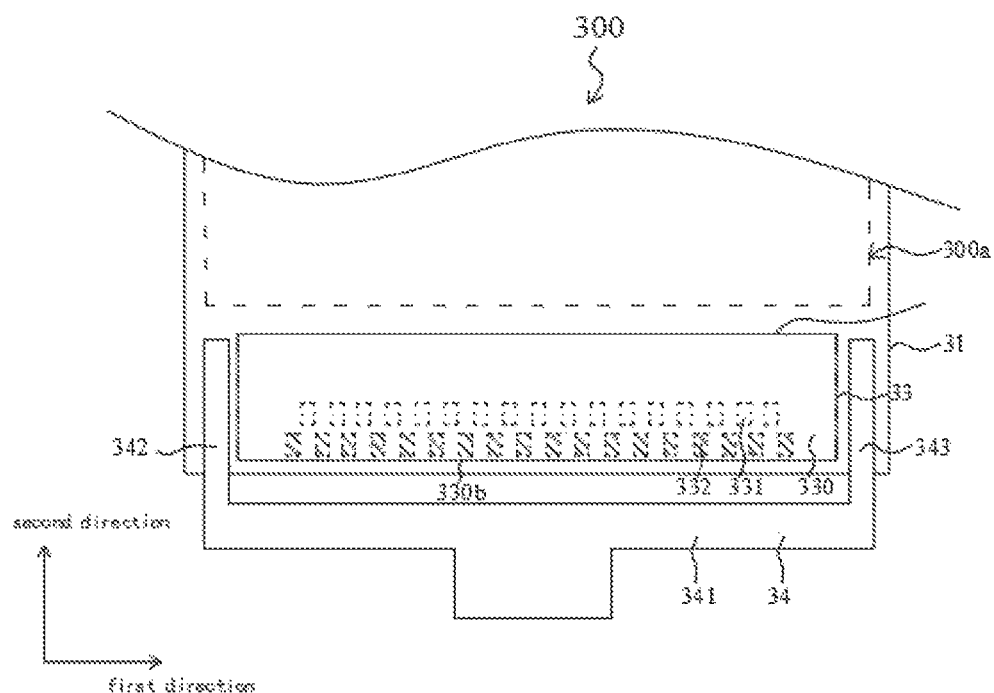
FIG. 5 is a schematic plan view of a driver chip and a flexible printed circuit board are attached to an array substrate.

Please refer to FIGS. 2 to 5, FIG. 2 is a schematic view of the display panel according to a first embodiment of the disclosure, FIG. 3 is a first schematic cross-sectional view taken along an A-A line of the display panel shown in FIG. 2, FIG. 4 is a schematic view of the driver chip in FIG. 2 attached to the first conductive pad and the second conductive pad in FIG. 3, and FIG. 5 is a schematic plan view of the driving chip and the flexible printed circuit board attached to the array substrate. The display panel 300 can be a liquid crystal display panel, and the display panel 300 can also be an organic light-emitting diode display panel. Specifically, the display panel 300 is a fringe field switching (Fringe Field Switching, FFS) liquid crystal display panel. It is understandable that the display panel 300 can also be an in-plane switching (IPS) liquid crystal display panel or a vertical alignment liquid crystal display panel. The display panel 300 includes a display area 300*a* and a pad area 300*b*, and the pad area 300*b* is disposed on one side of the display area 300*a*. The display panel 300 includes an array substrate 31, a driving chip 33, and a flexible printed circuit board 34, and both the driving chip 33 and the flexible printed circuit board 34 are attached to the pad area 300*b* of the array substrate 31.

In this embodiment, a portion of the display panel 300 corresponding to the display area 300*a* is used for display. In the display area 300*a*, the array substrate 31 includes a plurality of thin film transistors disposed in an array, pixel electrodes, common electrodes, scan lines, and data lines.

In this embodiment, the pad area 300*b* is provided with a plurality of conductive pads, and the driving chip 33 is attached to the plurality of conductive pads of the pad area 300*b*, that is, the driving chip 33 of the display panel 300 is attached on glass (Chip On Glass, COG). Part of the conductive pads is used to input electrical signals and transmit to the driving chip 33, and to provide working signals for the driving chip 33 to work; part of the conductive pads is used to output electrical signals to the display area 300*a* of the display panel 300 to provide display signals for the display panel 300. The plurality of conductive pads includes a plurality of first conductive pads 311 and a plurality of second conductive pads 312. The plurality of first conductive pads 311 are disposed side by side in a straight line along a first direction, and the plurality of second conductive pads 312 are disposed side by side in a straight line along the first direction; the second conductive pads 312 are located on one side of the first conductive pad 311 away from the display area 300*a*, and the plurality of second conductive pads 312 and the plurality of first conductive pads 311 are disposed in a staggered manner along a second direction, and then a wiring connected to the conductive pad 312 can extend from an area between two adjacent first conductive pads 311. The second direction is a direction that the display area 300a points toward the pad area 300b, and the first direction is perpendicular to the second direction.

In this embodiment, the driver chip 33 includes a base 330, a plurality of first pins 331, and a plurality of second pins 332. The driver chip 33 includes a first edge 330a and a second edge 330b. The first edge 330a is opposite to the second edge 330b. When the driver chip 33 is attached to the array substrate 31, the first edge 330a is close to the display area 300a and the second edge 330b is far away from the display area 300a. The plurality of first pins 331 and the plurality of second pins 332 are disposed on the base 330 and close to the second edge 330b. A distance from the first pins 331 to the first edge 330a is greater than a distance from the first pins 331 to the second edge 330b, and a distance from the second pins 332 and the first edge 330a is greater than a distance from the second pins 332 to the second edge 330b. The plurality of first pins 331 are located on a side of the plurality of second pins 332 away from the second edge 330b, that is, the second pins 332 are located on one side of the first pins 331 away from the display area 100a, and the first pins 331 and the second pins 332 are disposed staggered along the second direction. A thickness of the first pins 331 is equal to a thickness of the second pins 332.

In this embodiment, the array substrate 31 includes a substrate 313, a light-shielding layer 314, a buffer layer 315, a semiconductor layer 316, a gate insulating layer 317, a first metal layer 318, an interlayer insulating layer 319, a second metal layer 320, a planarization layer 321, a first transparent conductive layer 322, a passivation layer 323, and a second transparent conductive layer 324 stacked in sequence.

In this embodiment, the substrate 313 is a glass substrate, the substrate 313 includes a bearing surface 313a, and the bearing surface 313a is a flat horizontal surface.

In this embodiment, the light-shielding layer 314 includes a light-shielding pattern 3141 and a light-shielding piece 3142. The light-shielding pattern 3141 is formed on the bearing surface 313a of the substrate 313 and located in the display area 300a. The light-shielding pattern 3141 is configured for light-shielding. The light-shielding piece 3142 is formed on the substrate 313 and located in the pad area 300b, the light-shielding piece 3142 is disposed correspondingly to the second conductive pads 312. The light-shielding layer 314 is a metal layer. A thickness of the light-shielding layer 314 is about 450 angstroms to 550 angstroms. The light-shielding layer 314 is made of a material selected from a group consisting of molybdenum, aluminum, titanium, copper, and silver.

In this embodiment, the buffer layer 315 covers the light-shielding layer 314 and the substrate 313, and the buffer layer 315 is located in the display area 300a and the pad area 300b. A thickness of the buffer layer 315 is 2500 angstroms to 3500 angstroms. The buffer layer 315 includes a silicon nitride layer and a silicon oxide layer. The silicon nitride layer is close to the substrate 313 and the silicon oxide layer is away from the substrate 313.

In this embodiment, the semiconductor layer 316 is formed on the buffer layer 315, and the semiconductor layer 316 includes active pattern 3161. The active pattern 3161 is located in the display area 300a and disposed corresponding to the light-shielding pattern 3141. The semiconductor layer 316 is made from a material selected from any one of amorphous silicon, polysilicon, and metal oxide. A thickness of the semiconductor layer 316 is 400 angstroms to 500 angstroms.

In this embodiment, the gate insulating layer 317 covers the semiconductor layer 316 and the buffer layer 315, and the gate insulating layer 317 is located in the display area 300a and the pad area 300b. A thickness of the gate insulating layer 317 is 1000 angstroms to 1500 angstroms. The gate insulating layer 317 is made of silicon nitride or silicon oxide.

In this embodiment, the first metal layer 318 is disposed on the gate insulating layer 317. The first metal layer 318 includes a gate 3181, a first metal member 3182, and a second metal member 3183. The gate 3181 is located in the display area 300a and disposed corresponding to the source patterns 3161. The first metal member 3182 and the second metal member 3183 are both located in the pad area 300b, the second metal member 3183 is located on one side of the first metal member 3182 away from the display area 300a, the second metal member 3183 is located directly above the light-shielding piece 3142, a thickness of the gate 3181, a thickness of the first metal member 3182, and a thickness of the second metal member 3183 are same. A thickness of the first metal layer 318 is between 2500 angstroms and 3500 angstroms. The first metal layer 318 is made from a material selected from a group consisting of molybdenum, aluminum, titanium, copper, and silver.

In this embodiment, the interlayer insulating layer 319 covers the first metal layer 318 and the gate insulating layer 317, and the interlayer insulating layer 319 is located in the display area 300a and the pad area 300b. A thickness of the interlayer insulating layer 319 is 5500 angstroms to 6500 angstroms. The interlayer insulating layer 319 is made from a material selected from at least one of silicon nitride and silicon oxide.

In this embodiment, the second metal layer 320 is disposed on the interlayer insulating layer 319. The second metal layer 320 includes a source electrode 3201, a drain electrode 3202, a third metal member 3203, and a fourth metal member 3204. The source electrode 3201 and the drain electrode 3202 are located in the display area 300a and are disposed on opposite sides of the gate 3181. The source electrode 3201 is in contact with the active pattern 3161 through a first through hole penetrating the interlayer insulating layer 319 and the gate insulating layer 317, and the drain electrode 3202 is in contact with the active pattern 3161 through a second through hole penetrating the interlayer insulating layer 319 and the gate insulating layer 317. The third metal member 3203 is disposed corresponding to the first metal member 3182 and electrically connected to the first metal member 3182 through a third through hole 319a penetrating the interlayer insulating layer 319, and the fourth metal member 3204 is disposed corresponding to the second metal member 3183 and electrically connected to the second metal member 3183 through a fourth through hole 319b penetrating the interlayer insulating layer 319. The source electrode 3201, the drain electrode 3202, the third metal member 3203, and the fourth metal member 3204 have same thickness. A thickness of the second metal layer 320 is about 4000-6500 angstroms. A material of the second metal layer 320 is selected from a group consisting of molybdenum, aluminum, titanium, copper, and silver.

In this embodiment, the planarization layer 321 covers the second metal layer 320 and the interlayer insulating layer 319. The planarization layer 321 includes a first opening 321a located in the pad area 300b. The first opening 321a exposes the third metal member 3203 and the fourth metal members 3204. A thickness of the planarization layer 321 is 2.0 micrometers to 3.0 micrometers. The planarization layer 321 is made from polyimide or polyacrylate.

In this embodiment, the first transparent conductive layer 322 is formed on the planarization layer 321 and located in the display area 300a, and the first transparent conductive layer 322 is a common electrode layer. A material of the first transparent conductive layer 322 is indium tin oxide. A thickness of the first transparent conductive layer 322 is 500 angstroms to 700 angstroms.

In this embodiment, in the display area 300a, the passivation layer 323 covers the first transparent conductive layer 322; in the pad area 300b, the passivation layer 323 covers the planarization layer 321, the interlayer insulating layer 319, the third metal member 3203, and the fourth metal member 3204. The passivation layer 323 includes a second opening 323a corresponding to the third metal member 3203 and a third opening 323b corresponding to the fourth metal member 3204. A thickness of the passivation layer 323 is 800 angstroms to 1200 angstroms. The passivation layer 323 is made from any one of silicon nitride or silicon oxide.

In this embodiment, the second transparent conductive layer 324 of the display area 300a is formed on the passivation layer 323. The second transparent conductive layer 324 includes a plurality of mutually independent pixel electrodes 3241, a first transparent conductive member 3242, and a second transparent conductive member 3243. At least a part of the first transparent conductive member 3242 is located in the second opening 323a and located on the third metal member 3203, and at least a part of the second transparent conductive member 3243 is located in the third opening 323b and located on the fourth metal member 3204. The pixel electrode 3241, the first transparent conductive member 3242 and the second transparent conductive member 3243 have a same thickness. The second transparent conductive layer 324 is made from indium tin oxide. A thickness of the second transparent conductive layer 324 is 450 angstroms to 550 angstroms.

In this embodiment, the first metal member 3182, the third metal member 3203, and the first transparent conductive member 3242 together form a first conductive pad 311. The first conductive pad 311 includes a first bonding surface 311a for bonding to the driving chip 33. At least a part of the first bonding surface 311a is parallel to the bearing surface 313a. The second metal member 3183, the fourth metal member 3204, and the second transparent conductive member 3243 together form a second conductive pad 312. The second conductive pad 312 includes a second bonding surface 312a for bonding to the driving chip 33. At least part of the second bonding surface 312a is parallel to the bearing surface 313a. A thickness of the first conductive pad 311 is equal to a thickness of the second conductive pad 312. Since the light-shielding piece 3142 is disposed between the second conductive pad 312 and the substrate 313, the second conductive pad 312 is elevated higher relative to the first conductive pad 311, and a distance between the at least a part of the first bonding surface 311a parallel to the bearing surface 313a and the substrate 313 is less than a distance between the at least a part of the second bonding surface 312a parallel to the bearing surface 313a and the substrate 313. As shown in FIG. 3, the first bonding surface 311a and the second bonding surface 312a are both parallel to the bearing surface 313a and are used for bonding with the driving chip 33. It is understood that the first bonding surface 311a and the second bonding surface 312a can also include a part that is not parallel to the bearing surface 313a.

In this embodiment, as shown in FIG. 4, the display panel further includes a first conductive adhesive layer 401 and a second conductive adhesive layer 402. Both the first conductive adhesive layer 401 and the second conductive adhesive layer 402 have conductivity. The first conductive adhesive layer 401 is filled between the first conductive pads 311 and the first pins 331 and used for electrically connecting the first conductive pads 311 and the first pins 331, and the second conductive adhesive layer 402 is filled between the second conductive pads 312 and the second pins 332 and used for electrically connecting the second conductive pads 312 and the second pins 332, and the first conductive adhesive layer 401 and the second conductive adhesive layer 402 are connected by an anisotropic conductive adhesive and are electrically insulated. A thickness of the conductive adhesive layer 401 is same as a thickness of the second conductive adhesive layer 402. Wherein, the first conductive adhesive layer 401 and the second conductive adhesive layer 402 are both anisotropic conductive adhesive. The first conductive adhesive layer 401 and the second conductive adhesive layer 402 are formed through an anisotropic conductive adhesive layer that is bonded to the array substrate and is pressed, and conductive particles 40a in the anisotropic conductive adhesive layer are pressed to contact and conduct with each other, and the first conductive adhesive layer 401 and the second conductive adhesive layer 402 is obtained. That is, the first conductive adhesive layer 401 and the second conductive adhesive layer 402 are conductive adhesive layers after anisotropic conductive adhesives were pressed. A thickness of the first conductive adhesive layer 401 and a thickness of the second conductive adhesive layer 402 are a thickness corresponding to the anisotropic conductive adhesive with conductivity after being pressed. The conductive particles 40a in the anisotropic conductive adhesive between the adhesive layer 401 and the second conductive adhesive layer 402 are not stressed and are scattered and disposed, resulting in no conductive path being formed, so that the first conductive adhesive layer 401 and the second conductive adhesive layer 402 are electrically insulated. Since the distance from the first bonding surface 311a to the substrate 313 is less than the distance from the second bonding surface 312a to the substrate 313, a thickness of the first conductive adhesive layer 401 is the same as a thickness of the second conductive adhesive layer 402, and a distance between a first surface 401a of the first conductive adhesive layer 401 close to the first pins 331 and the substrate 313 is less than a distance between a second surface 402a of the second conductive adhesive layer 402 close to the second pins 332 and the substrate 313.

It should be noted that in other embodiments, the distance from the first bonding surface 311a to the substrate 313 may also be equal to the distance from the second bonding surface 312a to the substrate 313. At this time, the thickness of the first conductive adhesive layer 401 is less than the thickness of the second conductive adhesive layer 401; alternatively, the thickness of the first conductive adhesive layer 401 is less than the thickness of the second conductive adhesive layer 401, in combination with the distance from the first bonding surface 311a to the substrate 313 less than the distance from the second bonding surface 312a to the substrate 313, so that a distance between a first surface 401a of the first conductive adhesive layer 401 close to the first pins 331 and the substrate 313 is less than a distance between a second surface 402a of the second conductive adhesive layer 402 close to the second pins 332 and the substrate 313.

As shown in FIGS. 2 and 4, since a blank area 300b2 of the pad area 300b close to the display area 300a is without conductive pads, the plurality of first pins 331 and the plurality of first conductive pads 311 are disposed in a one-to-one correspondence and electrically connected through the conductive adhesive layer 401, one end of the driving chip 33 close to the display area 300a is unsupported and inclined downward. Correspondingly, the plurality of second pins 332 of the driving chip 33 will rise, and the plurality of elevated second pins 332, and the plurality of second conductive pads 312 elevated by the light-shading piece 3142 are disposed in a one-to-one correspondence and are electrically connected through the second conductive adhesive layer 402.

In this embodiment, as shown in FIG. 5, the flexible printed circuit board 34 includes a first binding portion 342, a second binding portion 343, and a main body portion 341. The first binding portion 342 and the second binding portion 343 are both connected to the main body portion 341, the first binding portion 342 and the second binding portion 343 are both attached to the pad area 300b and are located on opposite sides of the driving chip 33 along the direction perpendicular to a direction of the display area 300a pointing toward the pad area 300b. A design of the flexible printed circuit board 34 and the bonding method make the display panel 300 a narrow frame display panel.

It should be noted that the array substrate 31 also includes flexible printed circuit board binding areas (not shown) disposed on opposite sides of the pad area, and the flexible printed circuit board binding area of the array substrate is also provided with pads. The flexible printed circuit board is electrically connected to the bonding pads of the flexible printed circuit board. The existing technology is used here, and no detailed description is given here.

The display panel provided in this embodiment, a light-shielding member is provided under the second conductive pad corresponding to the elevated second pins on the driving chip to raise the second conductive pad. The elevated second conductive pads and the elevated second pins can be attached and electrically connected.

Figure 6:
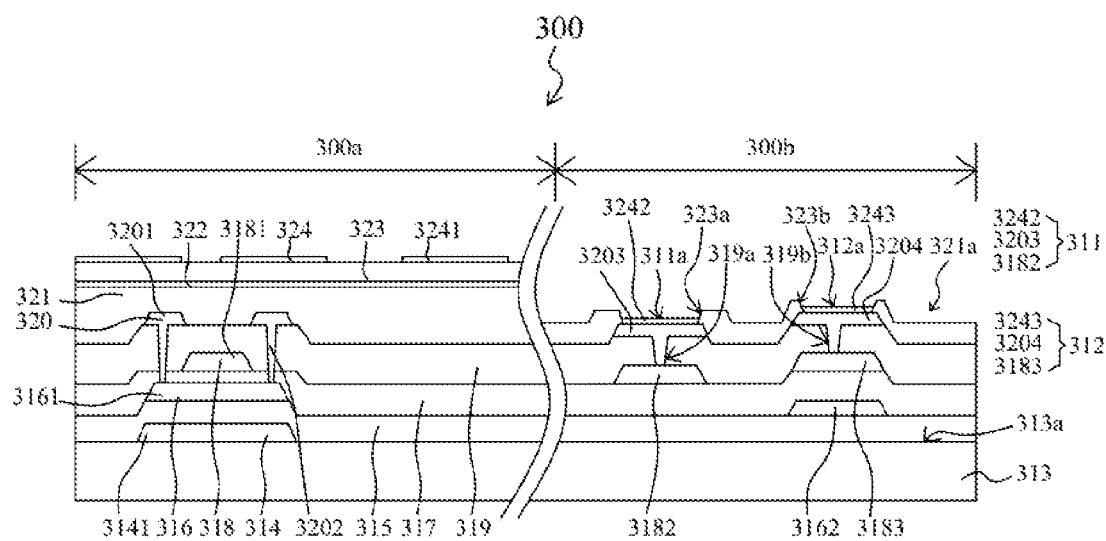
FIG. 6 is a second schematic cross-sectional view along the A-A line of the display panel shown in FIG. 2.

Please refer to FIG. 6, FIG. 6 is a second schematic cross-sectional view along the A-A line of the display panel shown in FIG. 2. The display panel shown in FIG. 6 is basically similar to the display panel shown in FIG. 3, except that the semiconductor layer 316 includes a semiconductor member 3162, the semiconductor member 3162 is located in the pad area 300b and corresponds to the second conductive pads 312; and the light-shielding layer 314 does not include a light-shielding member disposed in the pad area 300b.

Compared with the display panel shown in FIG. 3, the light-shielding piece 3142 in the light-shielding layer 314 is used to elevate the second conductive pad 312, and the display panel shown in FIG. 6, the second conductive pad 312 is elevated by a semiconductor member 3162 locating on a same layer as the active pattern 3161.

Figure 7:
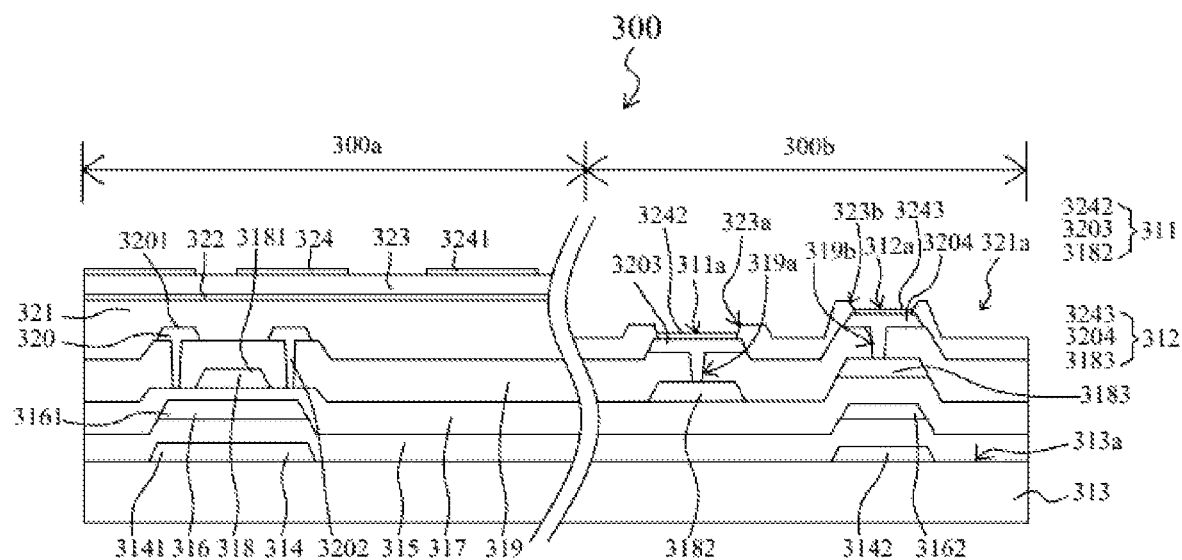
FIG. 7 is a third cross-sectional view along the A-A line of the display panel shown in FIG. 2.

Please refer to FIG. 7, FIG. 7 is a third cross-sectional view along the A-A line of the display panel shown in FIG. 2. The display panel shown in FIG. 7 is basically similar to the display panel shown in FIG. 3. The light-shielding layer 314 includes a light-shielding piece 3142. The light-shielding piece 3142 is located in the pad area 300b and corresponds to the second conductive pad 312. At the same time, the semiconductor layer 316 also includes a semiconductor member 3162, the semiconductor member 3162 is located in the pad area 300b and corresponds to the light-shielding piece 3142.

Compared with the display panel shown in FIG. 3 and FIG. 6, only a film layer is added between the second conductive pads 312 and the substrate 313, in the display panel shown in FIG. 7, the light-shielding piece 3142 and the semiconductor member 3162 are added at the same time, and then, the second conductive pad 312 are elevated higher, and more favorable for the bonding between the second conductive pads 312 and the second pins 332 that are lifted even higher.

Figure 8:
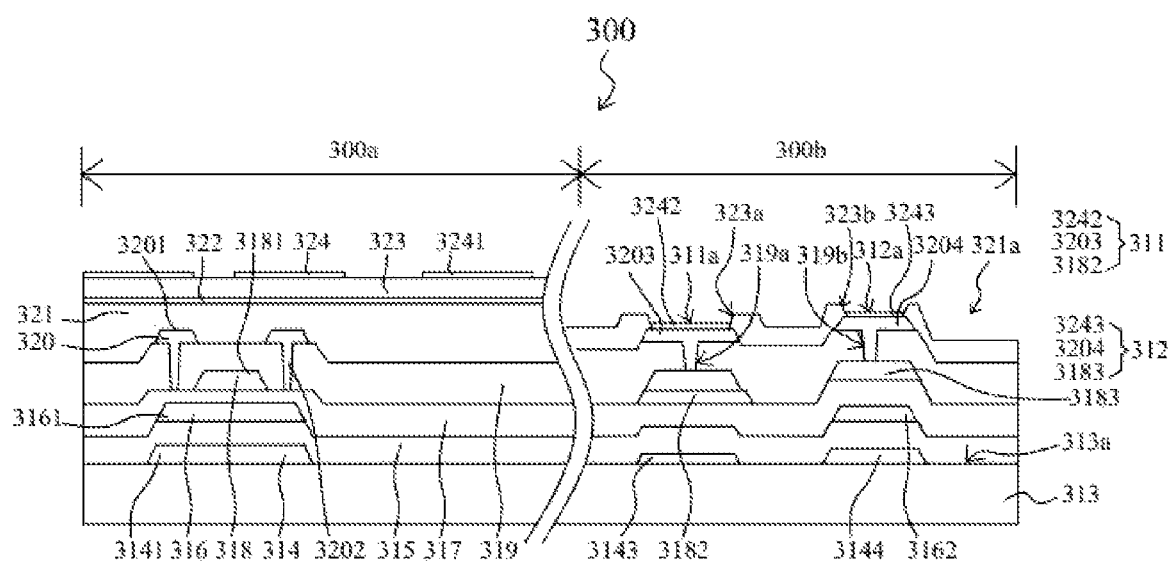
FIG. 8 is a fourth cross-sectional view along the A-A line of the display panel shown in FIG. 2.

Please refer to FIG. 8, FIG. 8 is a fourth cross-sectional view along the A-A line of the display panel shown in FIG. 2. The display panel shown in FIG. 8 is basically similar to the display panel shown in FIG. 7 except that, in a thickness direction of the display panel 300, a first film layer is provided between the first conductive pads 311 and the substrate 313, and a second film layer is provided between the plurality of the second conductive pads 312 and the substrate 313, the first film layer is located in the pad area 300b and corresponds to the plurality of the first conductive pad 311, and the second film layer is located in the pad area 300b and corresponds to the plurality of the second conductive pads 312, the first film layer and the second film layer are disposed in the same layer, and a thickness of the first film layer is less than a thickness of the second film layer.

Specifically, the light-shielding layer 314 includes a first light-shielding member 3143 provided in the pad area 300b and a second light-shielding member 3144 provided in the pad area 300b. The first film layer is the first light-shielding member 3143, and the second film layer is the second light-shielding member 3144. The first shading member 3143 is disposed corresponding to each first conductive pad 311, each second shading member 3144 is disposed corresponding to each second conductive pad 312, and a thickness of the first shading member 3143 is less than a thickness of the second shading member 3144. It is understandable that the first film layer can also be other film layers between the first conductive pads and the substrate, and the second film layer can also be other film layers between the plurality of the second conductive pad and the substrate, such as the first film layer and the second film layer are in a same layer as the active pattern.

In the display panels shown in FIGS. 3, 6, 7, and 8, a number of film layers between the first conductive pads 311 and the substrate 313 is less than a number of film layers between the plurality of the second conductive pads 312 and the substrate 313, so that a distance between the at least a part of the first bonding surface 311a of the first conductive pad 311 parallel to the bearing surface 313a of the substrate 313 and the substrate 313 is less than a distance between the at least a part of the second bonding surface 312a of the second conductive pad 312 parallel to the bearing surface 313a of the substrate 313 and the substrate 313. In the display panel shown in FIG. 8, a thickness of the first film layer between the plurality of the first conductive pads 311 and the substrate 313 is less than a thickness of the second film layer between the plurality of the second conductive pads 312 and the substrate 313, so that a distance between the at least part of the first bonding surface 311a of the first conductive pad 311 parallel to the bearing surface 313a of the substrate 313 and the substrate 313 is less than a distance between the at least part of the second bonding surface 312a of the second conductive pad 312 parallel to the bearing surface 313a of the substrate 313 and the substrate 313. It is understandable that one or more other film layers not included in the display area 300a can also be added between the second conductive pad 312 and the substrate 313. The film layers include, but are not limited to, a metal layer, an insulating layer, and a planarization layer. The film layers are configured to raise the plurality of the second conductive pads 312, and the elevated second conductive pads 312 and the elevated second pins 332 are attached and electrically connected.

Figure 9:
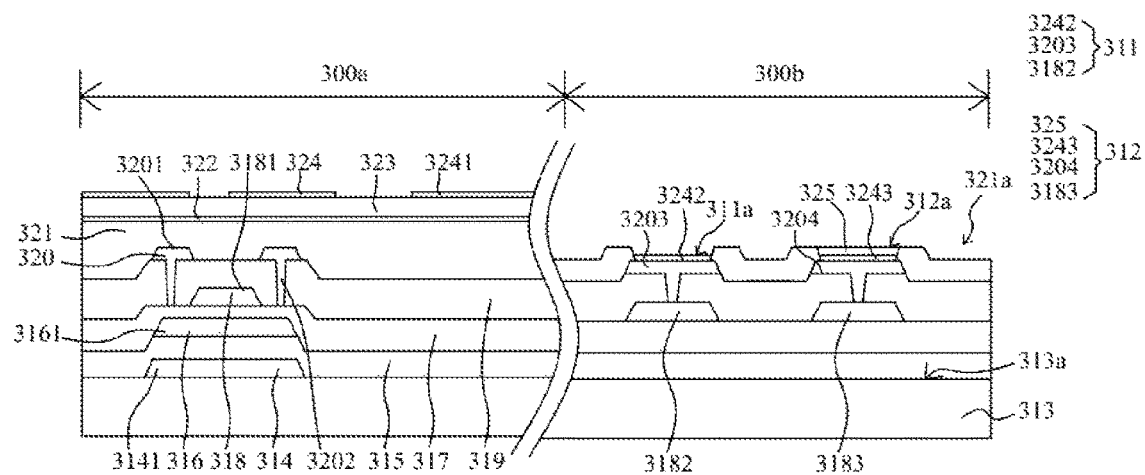
FIG. 9 is a fifth cross-sectional view along the A-A line of the display panel shown in FIG. 2.

Please refer to FIG. 9, FIG. 9 is a fifth cross-sectional view along the A-A line of the display panel shown in FIG. 2. The display panel shown in FIG. 9 is similar to the display panel substrate shown in FIG. 3, except that a thickness of the first conductive pad 311 is less than a thickness of the second conductive pad 312, and the light-shielding layer 314 shown in FIG. 9 does not include the shading member disposed in the pad area 300b.

In this embodiment, the number of film layers of the first conductive pad 311 is less than the number of film layers of the second conductive pad 312. Specifically, the first conductive pad 311 comprises the first metal member 3182, the third metal member 3203, and the first transparent conductive member 3242; and the second conductive pad 312 comprises the second metal member 3183, the fourth metal member 3204, the second transparent conductive member 3243, and the conductive member 325. The conductive member 325 is disposed on the second transparent conductive member 3243, that is, the number of film layers of the second conductive pad 312 is increased, so that the number of film layers of the first conductive pad 311 is less than the number of film layers of the second conductive pad 312. Wherein, the conductive member 325 may be a transparent conductive layer or a metal conductive layer. It is understandable that the first conductive pad 311 can also include the first metal member 3182 and the third metal member 3203, and the second conductive pad 312 can include the second metal member 3183, the fourth metal member 3204 and the second transparent conductive member 3243, such that the number of film layers of the first conductive pad 311 is reduced, so that the number of film layers of the first conductive pad 311 is less than the number of film layers of the second conductive pad 312.

The display panel shown in FIG. 9, a conductive member 325 is added on the second transparent conductive member 3243, so that the second bonding surface 312a of the second conductive pad 312 for bonding with the drive chip 33 is higher, this is beneficial to bond and electrically connect the second conductive pad 312 to the elevated second pin 332 on the drive chip 33. It is also possible to reduce the number of film layers of the first conductive pad 311, so that the second conductive pad 312 is combined with the second bonding surface 312a of the driving chip 33.

Figure 10:
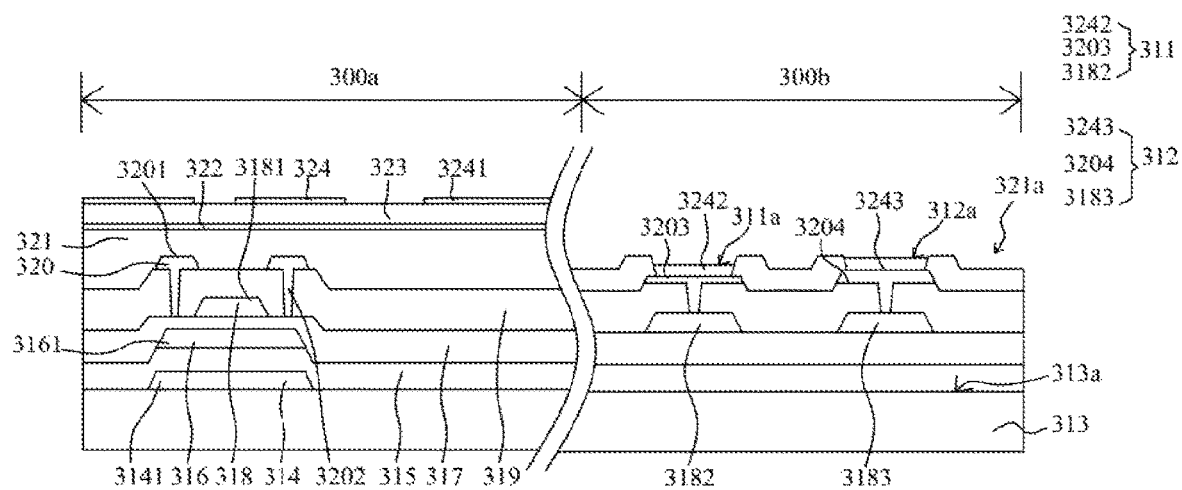
FIG. 10 is a sixth cross-sectional view along the A-A line of the display panel shown in FIG. 2.

Please refer to FIG. 10, FIG. 10 is a sixth cross-sectional view along the A-A line of the display panel shown in FIG. 2. The display panel shown in FIG. 10 is basically similar to the display panel shown in FIG. 3, except that each the first conductive pad 311 includes a first conductive film, each the second conductive pad 312 includes a second conductive film, and the second conductive film is disposed in the same layer with the first conductive film. A thickness of the first conductive film is less than a thickness of the second conductive film, and the light-shielding layer 314 shown in FIG. 10 does not include the light-shielding member provided in the pad area 300b.

Specifically, each the first conductive pad 311 comprises the first metal member 3182, the third metal member 3203, and the first transparent conductive member 3242; and the second conductive pad 312 comprises the second metal member 3183, the fourth metal member 3204, and the second transparent conductive member 3243. A thickness of the first metal member 3182 is equal to a thickness of the second metal member 3183, a thickness of the third metal member 3203 is less than a thickness of the fourth metal member 3204, and a thickness of the first transparent conductive member 3242 is equal to a thickness of the second transparent conductive member 3243. It is understandable that a thickness of the first metal member 3182 can be less than a thickness of the second metal member 3183, a thickness of the third metal member 3203 is equal to a thickness of the fourth metal member 3204, and a thickness of the first transparent conductive member 3242 is equal to a thickness of the second transparent conductive member 3243.

The display panel shown in FIG. 10, a thickness of the conductive film comprised in the first conductive pad 311 is less than a thickness of the conductive film comprised in the second conductive pad 312, so that a distance from the second bonding surface 312a of the second conductive pad 312 to the substrate 313 is bigger than a distance from the first bonding surface 311a of the first conductive pad 311 to the substrate 313, in this way, it is beneficial for the elevated second pins 332 of the drive chip 33 to be combined with the second binding surface 312a of the second conductive pad 312.

The display panel shown in FIG. 9 and the display panel shown in FIG. 10, the number of film layers of the first conductive pad 311 is adjusted to be less than the number of film layers of the second conductive pads 312, or, a thickness of the conductive film layer of the first conductive pads 311 is adjusted to be less than a thickness of the conductive film layer of the second conductive pads 312. In this way, a thickness of the first conductive pad 311 is less than a thickness of the second conductive pad 312, so that the distance from the second bonding surface 312a of the second conductive pads 312 to the substrate 313 is greater than a distance from the first bonding surface 312a of the first conductive pads 312 to the substrate 313, and then the second binding surface 312a is attached to the elevated second pins 332 of the drive chip 33.

It should be noted that, as shown in FIG. 9, the number of film layers of the first conductive pad 311 is less than the number of film layers of the second conductive pad 312; in FIG. 10, a thickness of the first conductive film of the first conductive pad 311 is less than a thickness of the second conductive film of the second conductive pad 312; in FIG. 3, FIG. 6, and FIG. 7, the number of film layers between the first conductive pad and the substrate is less than the number of film layers between the second conductive pad and the substrate; and in FIG.8, a thickness of the first film layer between the first conductive pad 311 and the substrate 313 that is less than a thickness of the second film layer between the second conductive pad and the substrate, in a same layer as the first film layer, can be combined, such that the distance from the second bonding surface 312a of the second conductive pad 312 to the substrate is greater than the distance from the first bonding surface 311a of the first conductive pad 311 to the substrate.

Figure 11:
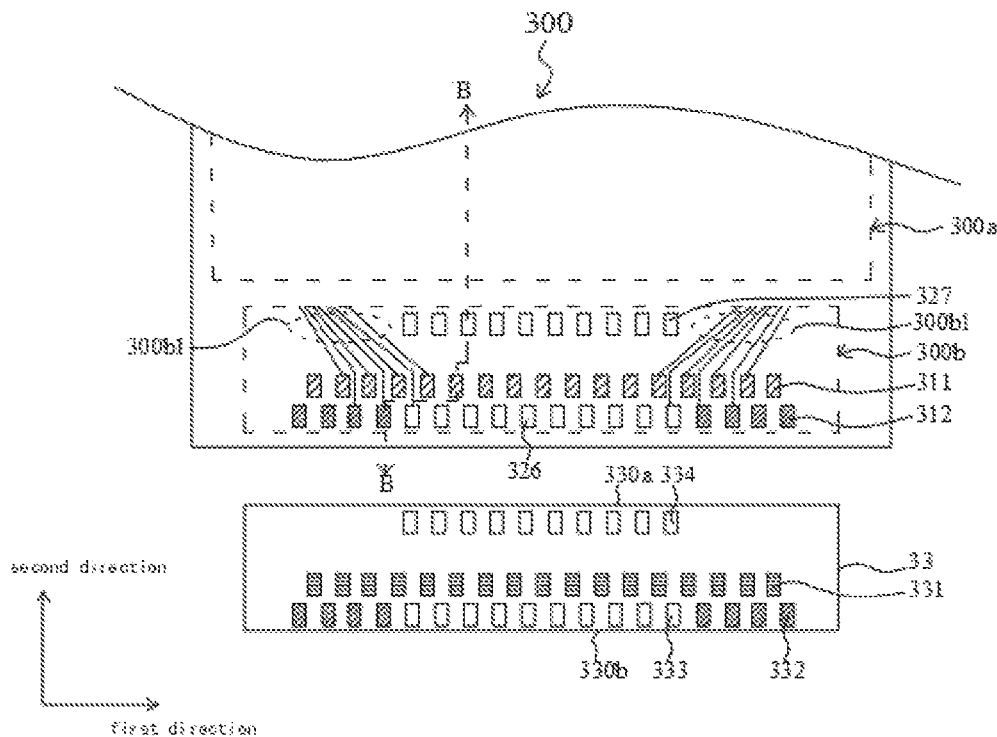
FIG. 11 is a schematic view of a display panel according to a second embodiment of this disclosure.
Figure 12:
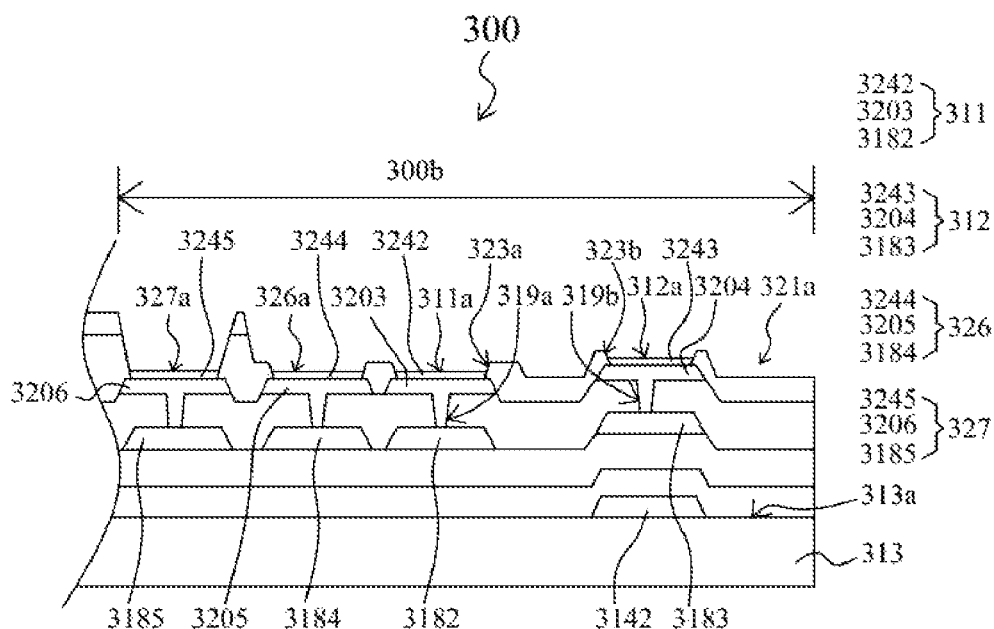
FIG. 12 is a cross-sectional view along a B-B line of the display panel shown in FIG. 11.

Please refer to FIG. 11 and FIG. 12, FIG. 11 is a schematic view of a display panel according to a second embodiment of the present disclosure, and FIG. 12 is a cross-sectional view along a B-B line of the display panel shown in FIG. 11. The display panel shown in FIG. 11 is basically similar to the display panel shown in FIG. 3, and the array substrate 31 includes a plurality of first conductive pads 311, a plurality of second conductive pads 312, a plurality of third conductive pads 326, and a plurality of redundant conductive pads 327, all disposed on the bearing surface 313a of the substrate 313. The plurality of first conductive pads 311, the plurality of second conductive pads 312, the plurality of third conductive pads 326, and the plurality of redundant conductive pads 327 are all disposed in the pad area 300b. The plurality of first conductive pads 311, the plurality of second conductive pads 312, and the plurality of third conductive pads 326 are configured for transmitting electrical signals, and the plurality of redundant conductive pads 327 do not transmit signals. The plurality of redundant conductive pads 327 are linearly disposed side by side along the first direction, the plurality of first conductive pads 311 are linearly disposed side by side along the first direction, and the plurality of redundant conductive pads 327 are located on one side of the first conductive pad 311 close to the display area 300a, the plurality of the second conductive pads 312 and the plurality of the third conductive pads 326 are disposed on one side of the plurality of first conductive pads 311 away from the display area 300a, the plurality of the second conductive pads 312 and the plurality of the third conductive pads 326 are linearly disposed side by side along the first direction, and the plurality of the second conductive pads 312 are symmetrically disposed on opposite sides of the plurality of the third conductive pads 326 along the first direction. One part of the first conductive pads 311 and the plurality of the second conductive pads 312 are disposed adjacently and staggered along the second direction (the direction of the display area 300a points to the pad area 300b), and the other part of the first conductive pads 311 and the plurality of the third conductive pads 326 are disposed adjacently and staggered disposed along the second direction, and the plurality of second conductive pads 312 are located on opposite sides of the redundant conductive pads 327 along the first direction, and one part of the first conductive pads 311 are also located on opposite sides of the redundant conductive pads 327 along the first direction. The first conductive pads 311 are the same as the first conductive pads shown in FIG. 3 described above, and the second conductive pads 312 are the same as the second conductive pads shown in FIG. 3 described above. The third conductive pads 326 comprises a fifth metal member 3184, a seventh metal member 3205, and a third transparent conductive member 3244. The redundant conductive pad 327 comprises a sixth metal member 3185, an eighth metal member 3206, and a fourth transparent conductive member 3245. The first conductive pad 311 includes a first bonding surface 311a, the second conductive pad 312 includes a second bonding surface 312a, the third conductive pad 326 includes a third bonding surface 326a, the third bonding surface 326a is parallel to the bearing surface, and a conductive adhesive layer is provided on the third bonding surface 326a. The redundant conductive pad 327 includes a redundant bonding surface 327a. The redundant bonding surface 327a is parallel to the bearing surface 313a. A distance between the at least part of the first bonding surface 311a parallel to the bearing surface 313a and the substrate 313 is less than a distance between at least part of the second bonding surface 312a parallel to the bearing surface 313a and the substrate 313; the distance between the at least part of the third bonding surface 326a parallel to the bearing surface 313a and the substrate 313 is less than the distance between at least part of the second bonding surface 312a parallel to the bearing surface 313a and the substrate 313; the distance between the at least part of the third bonding surface 326a parallel to the bearing surface 313a and the substrate 313 is equal to the at least part of the first bonding surface 311a parallel to the bearing surface 313a and the substrate 313; the distance between the at least part of the redundant bonding surface 327a parallel to the bearing surface 313a and the substrate 313 is equal to the distance between the at least part of the first bonding surface 311a parallel to the bearing surface 313a and the substrate 313.

In this embodiment, the driving chip 33 includes the first pins 331, the second pins 332, the third pins 333, and the redundant pins 334. The driver chip 33 includes a first edge 330a and a second edge 330b. The first edge 330a is opposite to the second edge 330b. When the driver chip 33 is attached to the display panel 300, the first edge 330a is close to the display area 300a, and the second edge 330b is away from the display area 300a. The redundant pins 334 are disposed side by side in a straight line close to the first edge 330a so that the plurality of redundant pins 334 are disposed close to the display area 300a, and the redundant pins 334 will not be connected to electrical signals. The first pins 331 are disposed side by side in a straight line close to the second edge 330b, the plurality of the second pins 332 and the plurality of the third pins 333 are located on the side of the plurality of the first pins 331 away from the display area 300a, and the plurality of the second pins 332 are disposed on opposite sides of the plurality of the third pins 333 along the first direction, a part of the first pin 331 is disposed adjacent and staggered disposed to the second pins 332 along the second direction and the part of the first pins 331 are located on opposite sides of the plurality of redundant pins 334 along the first direction, the other part of the first pins 331 is disposed adjacent and staggered disposed to the third pin 333 along the second direction and the plurality of the second pins 332 are symmetrically located on opposite sides of the plurality of redundant pins 334 along the first direction. A thickness of the first pins 331, a thickness of the second pins 332, a thickness of the third pins 333, and a thickness of the redundant pins 334 are all same.

When the driving chip 33 is attached to the display panel 300, the plurality of the redundant pins 334 and the plurality of the redundant conductive pads 327 are disposed one-to-one and electrically connected to each other, the plurality of the first pins 331 and the plurality of the first conductive pads 311 are disposed one-to-one and electrically connected to each other. The plurality of the third pins 333 and the plurality of the third conductive pads 326 are disposed one-to-one, and a conductive adhesive layer is filled between the third bonding surface 326a and the third pins 333. The wiring area 300b1 on opposite sides of the plurality of redundant conductive pad 327 is provided with a plurality of wirings. As a result, the redundant conductive pad 327 is not provided in the wiring area 300b1. The driving chip 33 is without support and is tilted down in the wiring area 300b1. Correspondingly, a plurality of the second pins 332 of the drive chip 33 are elevated, the plurality of the raised second pins 332 and a second bonding surface 312a of the elevated second conductive pad 312 are combined by a second conductive adhesive layer 402 filled between the two, and the second pins 332 are electrically connected to the second conductive pads 312, further, the plurality of the second pins 332 can be attached to the array substrate and the second pins 332 are electrically connected to the corresponding second conductive pads 312.

In this embodiment, since the plurality of second pins 332 are located on opposite sides of the plurality of redundant conductive pads 327 along the first direction, a supporting force provided by the redundant conductive pads 327 is different, and the lifted degree of the plurality of second pins 332 is also different. The farther the second pin 332 is from the redundant conductive pad 327, the less the supporting force will be, and the higher the upturn of the second pins 332, the distance between at least part of the second bonding surface 312a of the plurality of second conductive pads 312 parallel to the bearing surface 313a and the substrate 313 increases from close to the third conductive pad 326 to far away from the third conductive pad 326, so as to adapt elevated when the driver chip 33 is attached to the array substrate, the distance from the lifted second pins 332 to the substrate 313 increases from being close to the third conductive pad 326 to away from the third conductive pad 326.

It should be noted that, a distance from the at least part of the first bonding surface 311a of the first conductive pad 311, parallel to the bearing surface, to the substrate less than a distance from at least part of the second bonding surface 312a of the second conductive pad 312, parallel to the bearing surface, to the substrate. A distance from the bearing surface parallel to at least part of the substrate can be achieved by the aforementioned method, which will not be described in detail here.

Figure 13:
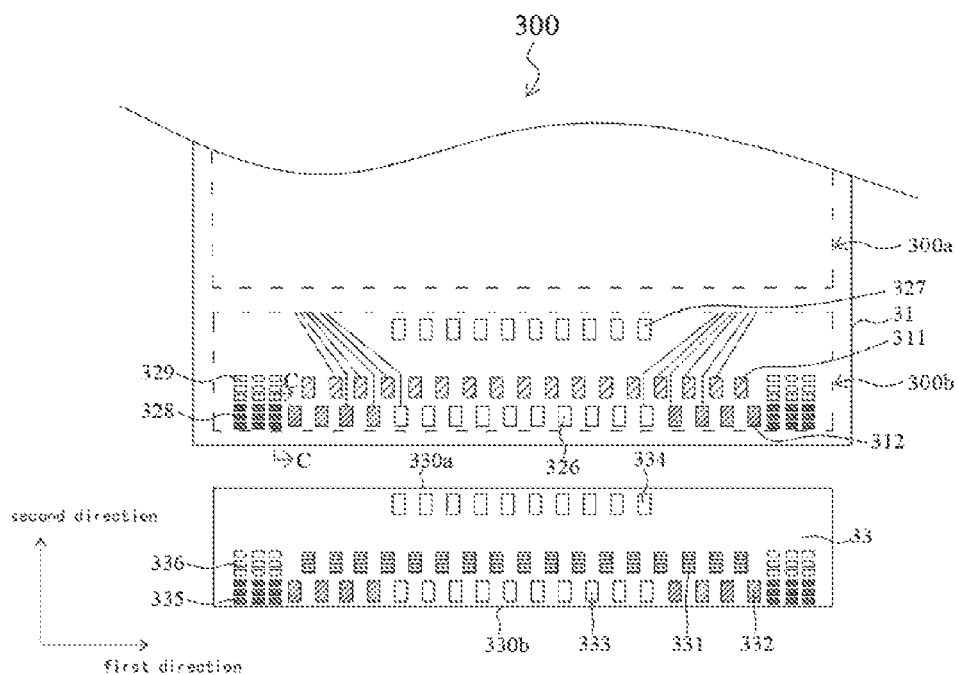
FIG. 13 is a schematic view of a display panel in a third embodiment of the present disclosure.
Figure 14:
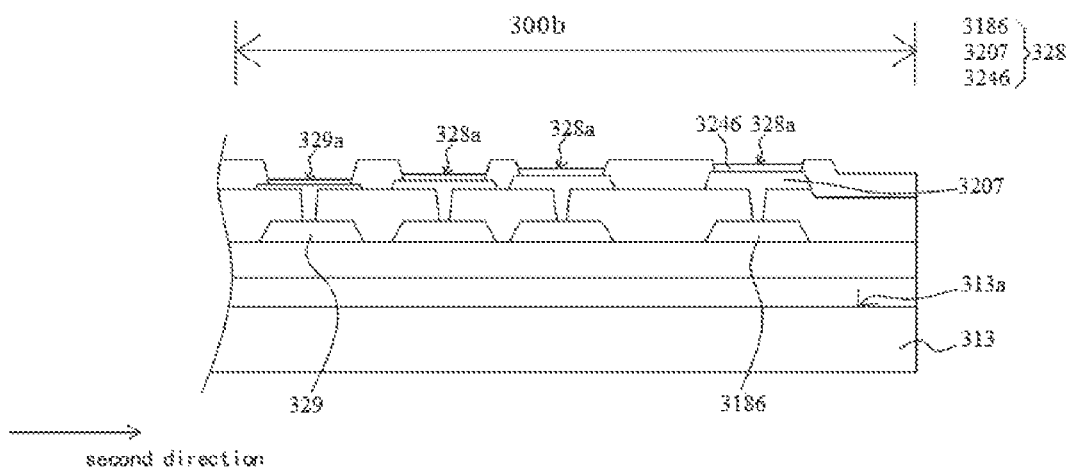
FIG. 14 is a cross-section view along a C-C line of the display panel as shown in FIG. 13.

Please refer to FIGS. 13-14. FIG. 13 is a schematic view of a display panel in a third embodiment of the disclosure, and FIG. 14 is a cross-section view along a C-C line of the display panel as shown in FIG. 13. The display panel shown in FIG. 13 is basically similar to the display panel shown in FIG. 12, except that the array substrate 31 further includes at least two rows of fourth conductive pads 328 and at least one row of fifth conductive pads 329, and at least two rows of the fourth conductive pads 328 are located on one side of at least one row of the fifth conductive pads 329 away from the display area 300a, at least two rows of the fourth conductive pads 328 and at least one row of the fifth conductive pads 329 are disposed along the second direction and located on one side of the redundant conductive pads 327 away from the display area 300a along the second direction. At least the two rows of the fourth conductive pads 328 are located on opposite sides of the second conductive pads 312 along the first direction, so at least two rows of the fourth conductive pad 328 are located on opposite sides of the redundant conductive pad 327 along the first direction, the at least one row of the fifth conductive pads 329 is located on opposite sides of the first conductive pads 311 along the first direction, so the at least one row of the fifth conductive pad 329 is located on opposite sides of the redundant conductive pad 327 along the first direction. Each the fourth conductive pad 328 includes a fourth bonding surface 328a, the fourth bonding surface 328a is parallel to the bearing surface 313a, and each the fifth conductive pad 329 has a fifth bonding surface 329a, the fifth bonding surface 329a is parallel to the bearing surface 313a. The driving chip 33 also includes at least two rows of fourth pins 335 and at least one row of fifth pins 336. The at least two rows of the fourth pins 335 are located on a side of the at least one row of the fifth pins 336 away from the display area. The at least two rows of fourth pins 335 and at least one row of fifth pins 336 are disposed along the second direction and are located on the side of the redundant pins 334 away from the display area 300a along the second direction. The at least two rows of the fourth pins 335 and the at least two rows of the fourth conductive pads 328 are disposed in a one-to-one correspondence and are electrically connected. The at least one row of the fifth pins 336 and the at least one row of the fifth conductive pads 329 are disposed in a one-to-one correspondence and are electrically connected. The fourth bonding surface 328a and the fourth pins 335 are opposite and a conductive adhesive layer is filled between the two, and the fifth bonding surface 329a and the fifth pins 336 are opposite and a conductive adhesive layer is filled between the two, a distance between the at least part of the fifth bonding surface 329a of the fifth conductive pads 329, parallel to the bearing surface 313a, and the substrate 313 is less than a distance between the at least part of the fourth bonding surface 328a of the fourth conductive pad 328 close to the fifth conductive pad 329, parallel to the bearing surface 313a, and the substrate 313. The distance from the at least a part of the fifth bonding surface 329a of the fifth conductive pad 329, parallel to the bearing surface 313a, to the substrate 313 is equal to the distance from at least a part of the first bonding surface 311a, parallel to the bearing surface of the first conductive pad 311, to the substrate. A distance between the part of the fourth bonding surface 328a of the at least two rows of the fourth conductive pads 328, parallel to the bearing surface 313a, and the substrate 313 increases from close to the display area 300a to away from the display area 300a, so as to adapt an increase in lifted degree of the fourth pins 335 corresponding to the fourth conductive pads 328 from close to the display area 300a to farther away from the display area 300a.

Specifically, each the fourth conductive pad 328 is consisted of a ninth metal member 3186, a tenth metal member 3207, and a fifth transparent conductive member 3246. The ninth metal members 3186 of the plurality of the fourth conductive pads 328 have same thickness. The fifth transparent conductive members 3246 of the fourth conductive pad 328 have same thickness, and the thickness of the tenth metal members 3207 of at least two rows of the fourth conductive pad 328 increases from close to the display area 300a to far from the display area 300a, so that the distance between the part of the fourth bonding surface 328a of the at least two rows of the fourth conductive pad 328, parallel to the bearing surface 313a, and the substrate 313 increases from being close to the display area 300a to far away from the display area 300a along the second direction.

It should be noted that, along the second direction, the opposite two sides of the plurality of the redundant conductive pads are blank areas without the redundant conductive pads. When the driving chip 33 is attached to the array substrate, the driving chip 33 without support in the blank areas will tilt down and the further away from the display area 300A, the higher the tilt of the fourth pins 335. Correspondingly, the fourth bonding surface 328a of the fourth conductive pads 328 corresponding to the fourth pins 335 needs to be higher. Along the first direction, since the plurality of the fourth conductive pads 328 are located on opposite sides of the plurality of the redundant conductive pads 327 along the first direction, the further the plurality of the fourth conductive pad 328 are from the redundant conductive pad 327, the less the support of the redundant conductive pad 327 is obtained by the fourth conductive pad 328, and the higher the lift of the fourth pins 335 are on the drive chip. Along the first direction, a distance between the at least part of the fourth bonding surfaces 328a of the at least two rows of the fourth conductive pads 328 parallel to the bearing surface 313a and the substrate 313 increases from close to the second conductive pad 312 to away from the second conductive pad 312, and a distance between the at least part of the fourth bonding surface 328a of the fourth conductive pad 328 adjacent to the second conductive pad 312 parallel to the bearing surface 313a and the substrate 313 is greater than a distance between the at least a part of the second bonding surface 312a of the second conductive pads 328 adjacent to the fourth conductive pad 312 parallel to the bearing surface 313a and the substrate 313.

Figure 15:
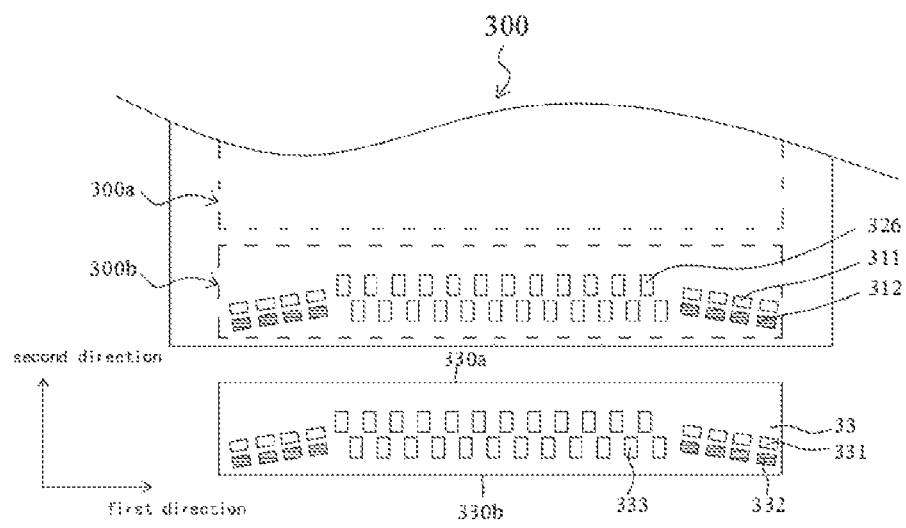
FIG. 15 is a schematic view of a display panel in a fourth embodiment of the present disclosure.

Please refer to FIG. 15, FIG. 15 is a schematic view of a display panel in a fourth embodiment of the present disclosure. The display panel shown in FIG. 15 is basically similar to the display panel shown in FIG. 2. The display panel 300 includes a plurality of first conductive pads 311, a plurality of second conductive pads 312, and a plurality of third conductive pads 326. The third conductive pads 326 are disposed in two rows. Two rows of the first conductive pads 311 are respectively disposed obliquely on opposite sides of the two rows of the third conductive pads 326 along the first direction, and the two rows of the second conductive pads 312 are respectively disposed obliquely on opposite sides of the two rows of the third conductive pads 326 along the first direction. The two rows of the second conductive pad 312 are respectively located on one side of the two rows of the first conductive pad 311 away from the display area 300a along the second direction, and one row of the first conductive pad 311 is adjacent to and disposed in parallel with a row of the second conductive pad 312; an angle between a straight line of one row of the first conductive pads 311 and a straight line of one row of the third conductive pads 326 is greater than 0 and less than 90 degrees. The driving chip 33 includes the first pins 331 corresponding one-to-one to the first conductive pads 311, the second pins 332 corresponding one-to-one to the second conductive pads 312, and the third pins 333 corresponding one-to-one to the third conductive pads 326, the plurality of the third pins 333 are disposed at a middle position of the driving chip 33 in two rows along the second direction, and the plurality of the first pins 331 are divided into two rows and are respectively disposed obliquely on opposite sides of the two rows of the third pins 333, The plurality of the second pins 332 are divided into two rows and disposed obliquely on opposite sides of the two rows of third pins 333. The two rows of the first pins 331 and the two rows of the second pins 332 are disposed close to the second edge 330b of the driving chip 33. The composition of the first conductive pad 311 and the composition of the second conductive pad 312 shown in FIG. 15 are respectively the same as the composition of the first conductive pad 311 and the composition of the second conductive pad 312 shown in FIG. 2, and will not be discussed further here The composition of the third conductive pad 326 shown in FIG. 15 is same as the composition of the first conductive pad 311 shown in FIG. 15.

Specifically, since when the driving chip 33 is attached to the display panel 300, one end of the driving chip 33 close to the display area 300a is not supported, and when the plurality of the first pins 331 of the driving chip 33 are attached to the first conductive pads 311 and the third pins 333 are attached to the third conductive pads 326, the end of the driving chip 33 close to the display area 300a is tilted down, and a plurality of the second pins 332 of the driving chip 33 are elevated, and the distance between the at least part of the first bonding surface 311a of the first conductive pad 311, parallel to the bearing surface 313a, to the substrate 313 is less than the distance between the at least part of the second bonding surface 312a of the second conductive pad 312, parallel to the bearing surface 313a, to the substrate 313, so that the elevated second pins 332 of the drive chip 33 is bonded with the elevated second bonding surface 312a of the corresponding second conductive pads 312.

Figure 16:
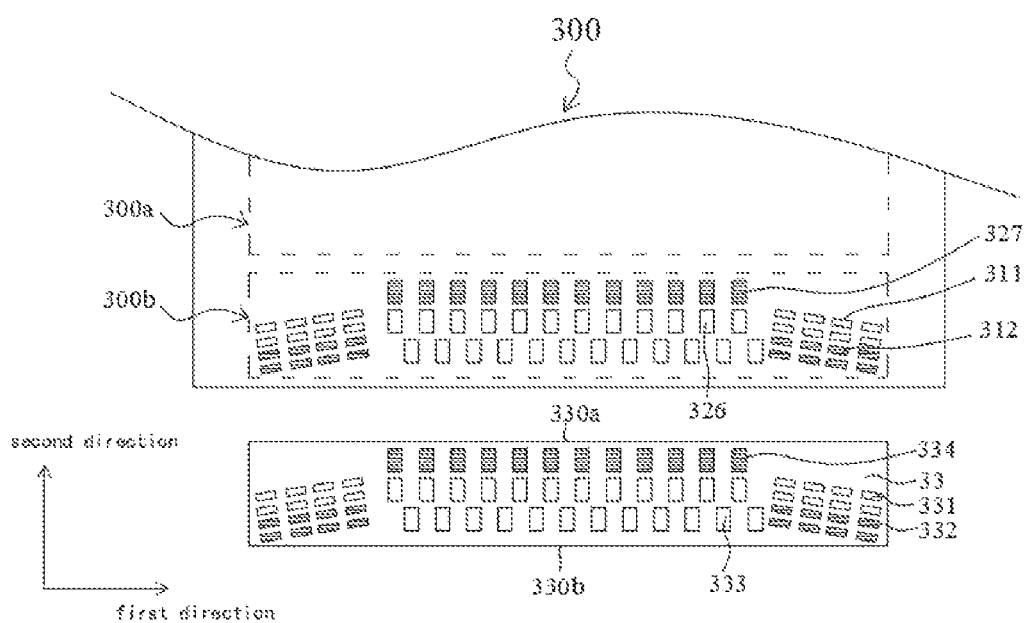
FIG. 16 is a schematic view of a display panel in a fifth embodiment of the present disclosure.

Please refer to FIG. 16, FIG. 16 is a schematic view of a display panel in a fifth embodiment of the present disclosure. The display panel shown in FIG. 16 is basically similar to the display panel shown in FIG. 15, except that the array substrate 31 further includes a plurality of redundant conductive pads 327, and the redundant conductive pads 327 are disposed on one side of the first conductive pad 311 close to the display area 300a along the second direction, disposed at least two rows of the first conductive pad 311 are respectively located on opposite sides of a plurality of redundant conductive pads 327 and two rows of the third conductive pad 326 along the first direction, at least two rows of the second conductive pad 312 are located on opposite sides of a plurality of redundant conductive pads 327 and two rows of the third conductive pad 326 along the first direction, and at least two rows of the second conductive pads 312 are located on a side of at least two rows of the first conductive pads 311 away from the display area 300a, the at least two rows of the second conductive pads 312 and the at least two rows of the first conductive pads 311 are disposed obliquely and parallel to each other; the driving chip 33 also includes a plurality of redundant pins 334, the redundant pins 334 are disposed at a position of the third pins 333 close to the first edge 330a, and the at least two rows of the first pins 331 are located on opposite sides of the plurality of redundant pins 334 and two rows of the third pin 333 along the first direction, the at least two rows of the second pins 332 are located on opposite sides of the redundant pins 334 and the two rows of the third pins 333 along the first direction, the at least two rows of the second pins 332 are located on one side of the at least two rows of the first pins 331 away from the display area, and at least two rows of the second pins 332 and at least two rows of the second pins 332 are slanted and parallel to each other.

When the driving chip 33 is attached to the array substrate 31, the third conductive pads 326 and the third pins are electrically connected through a conductive adhesive layer, and the first conductive pads 311 and the first pins 331 are electrically connected one-to-one through the first conductive adhesive layer, the second conductive pads 312 and the second pins 332 are electrically connected one-to-one through the second conductive adhesive layer, and the redundant conductive pads 327 and the redundant pins 334 are disposed and connected one-to-one. In the at least two rows of the second conductive pads 312, the distance from a part of at least two rows of the second bonding face 312a of the second conductive pads 312 in the second conductive pads 312, parallel to the bearing surface, to the substrate 313 is increased from close to the display area 300a to far away from the display area 300a, so as to adapt to an increase in the elevated degree of the second pins 332 from being close to the display area 300a to far away from the display area 300a when the driver chip 33 is attached to the array substrate.

Figure 17:
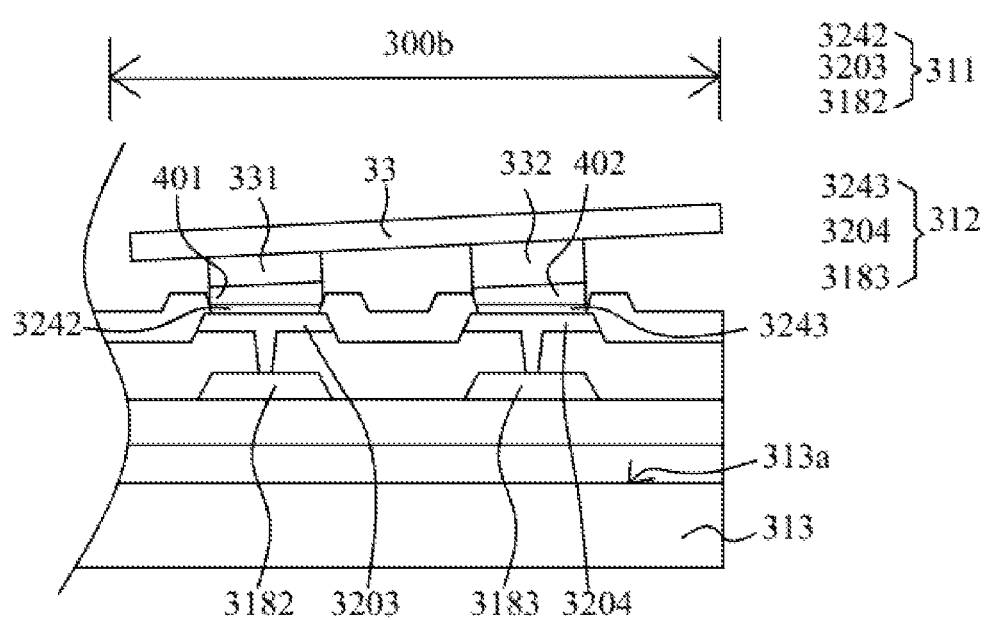
FIG. 17 is a schematic partial cross-sectional view of a display panel in a sixth embodiment of the present disclosure.

Please refer to FIG. 17, FIG. 17 is a schematic partial cross-sectional view of a display panel in a sixth embodiment of the disclosure. The display panel shown in FIG. 17 is basically similar to the display panel shown in FIG. 4, except that the first conductive pads 311 and the second conductive pads 312 have a same structure and a same thickness, and the thickness of the first pins 331 is less than the thickness of the second pins 332, and the elevated second pins 332 are electrically connected to the second conductive pads 312, and to ensure the driving chip 33 is attached to the array substrate 31.

In this embodiment, the thickness of the first pins is different from the thickness of the second pins, so as to compensate the distance between an elevated one from the first pins and the second pins and the substrate to ensure that the elevated one from the first pins and the second pins can be bound on the array substrate and electrically connected with the corresponding conductive pads.

It should be noted that a control of a thickness difference of the pins on the drive chip in this embodiment and a control of a height difference of the bonding surface of the conductive pads on the array substrate in FIGS. 3 to 16 can be used in combination to ensure that the drive chip is lifted and the pins can all be electrically connected to the corresponding conductive pads on the array substrate.

The present disclosure also provides a display device. The display device includes any one of the above-mentioned display panels and a backlight module, and the display panel is located on a light-emitting side of the backlight module.

The foregoing embodiments are merely some embodiments of the present disclosure, and descriptions thereof are relatively specific and detailed. However, it should not be understood as a limitation to the patent scope of the present disclosure. It should be noted that, a person of ordinary skill in the art may further make some variations and improvements without departing from the concept of the present disclosure, and the variations and improvements belong to the protection scope of the present disclosure. Therefore, the protection scope of the present disclosure shall be subject to the protection scope of the appended claims.

What is claimed is:

1. A display panel, wherein the display panel comprises a display area and a pad area, and the pad area is disposed on one side of the display area, the display panel comprising:
    a substrate comprising a bearing surface;
    a first conductive pad disposed on the bearing surface of the substrate, and the first conductive pad is located at the pad area;
    a second conductive pad disposed on the bearing surface of the substrate, and the second conductive pad is located at the pad area; and
    a driving chip bonded to the pad area, and the driving chip comprising:
    a first pin disposed corresponding to the first conductive pad;
    a second pin disposed corresponding to the second conductive pad;
    a first conductive adhesive layer filled between the first conductive pad and the first pin and electrically connected to the first conductive pad and the first pin; and
    a second conductive adhesive layer filled between the second conductive pad and the second pin and being electrically connected to the second conductive pad and the second pin;
    wherein a distance from a surface of the first conductive adhesive layer close to the first pin to the substrate is different from a distance from a surface of the second conductive adhesive layer close to the second pin to the substrate; and
    wherein the first conductive pad comprises a first bonding surface, the first bonding surface is at least partially parallel to the bearing surface and in contact with the first conductive adhesive layer, the second conductive pad comprises a second bonding surface, the second bonding surface is at least partially parallel to the bearing surface and in contact with the second conductive adhesive layer, and a distance between at least part of the first bonding surface parallel to the bearing surface to the substrate is different from a distance between at least part of the second bonding surface parallel to the bearing surface to the substrate.

2. The display panel in claim 1, wherein the second conductive pad is located on a side of the first conductive pad away from the display area, and the second pin is on a side of the first pin away from the display area, the distance from at least a portion parallel to the bearing surface to the substrate is less than the distance from at least a portion parallel to the bearing surface to the substrate, and a distance between the at least part of the first bonding surface parallel to the bearing surface and the substrate is less than a distance between the at least part of the second bonding surface parallel to the bearing surface and the substrate.

3. The display panel in claim 2, wherein a thickness of the first conductive pad is less than a thickness of the second conductive pad.

4. The display panel in claim 3, wherein a number of film layers forming the first conductive pad is less than a number of film layers forming the second conductive pad.

5. The display panel in claim 3, wherein the first conductive pad comprises a first conductive film; the second conductive pad comprises a second conductive film disposed on a same layer as the first conductive film; and a thickness of the first conductive film is less than a thickness of the second conductive film.

6. The display panel in claim 2, wherein a thickness of the first conductive pad is equal to a thickness of the second conductive pad.

7. The display panel in claim 2, wherein in a thickness direction of the display panel, a number of film layers between the first conductive pad and the substrate is less than a number of film layers between the second conductive pad and the substrate.

8. The display panel in claim 2, wherein in a thickness direction of the display panel, a first film layer is disposed between the first conductive pad and the substrate, a second film layer is disposed between the second conductive pad and the substrate, the first film layer is disposed in the pad area and corresponds to the first conductive pad, the second film layer is disposed in the pad area and corresponds to the second conductive pad, the first film layer is disposed in the same layer as the second film layer, and a thickness of the first film layer is less than a thickness of the second film layer.

9. The display panel in claim 2, wherein the display panel comprises a plurality of second conductive pads, the display panel further comprising:
    a plurality of redundant conductive pads disposed on the bearing surface of the substrate and located in the pad area, wherein the plurality of the redundant conductive pads are located on one side of the first conductive pad close to the display area, and the plurality of the second conductive pads are located on opposite sides of the plurality of the redundant conductive pads in a direction perpendicular to a direction of the display area pointing toward the pad area; and
    the drive chip comprising a plurality of the second pins, the drive chip further comprising:
    a plurality of redundant pins disposed in a one-to-one correspondence disposed to the plurality of redundant conductive pads and located on one side of the first pin close to the display area, and the plurality of the second pins are located on opposite sides of the plurality of redundant pins in a direction perpendicular to a direction of the display area pointing toward the pad area.

10. The display panel in claim 9, wherein a thickness of the first pin is less than or equal to a thickness of the second pin.

11. The display panel in claim 9, wherein the first conductive pad is a plurality, and the display panel further comprising:
    a third conductive pad disposed in the pad area and located on one side of the first conductive pads away from the display area and adjacent to and staggered with part of the first conductive pads along a direction of the display area pointing toward the pad area, and wherein the third conductive pad has a third bonding surface, the third bonding surface is at least partially parallel to the bearing surface, and the plurality of the second conductive pads are located on opposite sides of the third conductive pad in a direction perpendicular to a direction of the display area pointing toward the pad area;

the first pins are a plurality, and the drive chip further comprising:

a third pin disposed correspondingly one by one to the third conductive pads and electrically connected to the third conductive pads, and the third pins are located on one side of the first conductive pad away from the display area in a direction of the display area pointing toward the pad area and the third pins are adjacent to and staggered from the part of the first pins, the plurality of the second pins are located on opposite sides of the third pins in a direction perpendicular to a direction of the display area pointing toward the pad area;

wherein a conductive adhesive layer is filled between the third bonding surface and the third pins, and a distance between at least part of the third bonding surface parallel to the bearing surface to the substrate is different from a distance between the at least part of the second bonding surface parallel to the bearing surface to the substrate.

12. The display panel in claim 11, wherein a distance between at least part of the second bonding surface of the plurality of the second conductive pads parallel to the bearing surface to the substrate increases in a direction close to the third conductive pad to a direction away from the third conductive pad.

13. The display panel in claim 11, wherein a distance between the at least part of the third bonding surface parallel to the bearing surface and the substrate is equal to a distance between the at least part of the first bonding surface parallel to the bearing surface and the substrate.

14. The display panel in claim 9, further comprising:
at least two rows of fourth conductive pads disposed at the pad area, wherein at least the two rows of the fourth conductive pads are located on one side of the first conductive pads away from the display area, the at least two rows of the fourth conductive pads are located on opposite sides of the second conductive pads in a direction perpendicular to a direction of the display area pointing toward the pad area, and each row of the fourth conductive pads comprises at least two side-by-side disposed fourth conductive pads, the at least two rows of the fourth conductive pads are disposed in a direction of the display area pointing toward the pad area, and each of the fourth conductive pad has a fourth bonding surface; and the drive chip further comprising:
at least two rows of fourth pins disposed in a one-to-one correspondence with at least two rows of the fourth conductive pads and electrically connected, at least two rows of the fourth pins are located on a side of the first pins away from the display area, and located on opposite sides of the second pin in a direction perpendicular to a direction of the display area pointing toward the pad area;

wherein a conductive adhesive layer is filled between the fourth bonding surface and the fourth pins, the distance from at least a portion of the fourth bonding surface of the at least two rows of the fourth conductive pad, parallel to the bearing surface, to the substrate increases from close to the display area to far away from the display in a direction of the display area pointing toward the pad area.

15. The display panel in claim 14, wherein the distance from at least a portion of the fourth bonding surface of at least the two rows of the fourth conductive pad, parallel to the bearing surface, to the substrate increases from close to the second conductive pad to far away from the second conductive pad in a direction perpendicular to a direction of the display area pointing toward the pad area.

16. The display panel in claim 1, wherein the second conductive pad is located on one side of the first conductive pad away from the display area, the first conductive adhesive layer is connected to the second conductive adhesive layer and electrically insulated between the first conductive adhesive layer and the second conductive adhesive layer, and a thickness of the first conductive adhesive layer is less than a thickness of the second conductive adhesive layer.

17. The display panel in claim 1, the display panel further comprising:
a flexible printed circuit board comprising a first binding part, a second binding part and a main body part, the first binding part and the second binding part are connected with the main body part, the first binding part and the second binding part are both bonded to the pad area and located on opposite sides of the drive chip in a direction perpendicular to a direction of the display area pointing toward the pad area.

18. The display panel in claim 1, wherein the first pins and the second pins are plurality, and the plurality of first pins and the plurality of second pins are disposed on the side of the driving chip away from the display area, the drive chip further comprises a plurality of redundant pins disposed close to the display area, the plurality of the second pins are on a side of the plurality of the first pins away from the plurality of redundant pins in a direction of the display area pointing toward the pad area and at least part of the plurality of first pins are disposed adjacent to the plurality of second pins; and at least a part of the first pins are located on opposite sides of the plurality of redundant pins in a direction perpendicular to a direction of the display area pointing toward the pad area, and the plurality of the second pins are respectively located at opposite sides of the plurality of the redundant pins.

19. A display device, wherein the display device comprises a display panel, wherein the display panel comprises a display area and a pad area, and the pad area is disposed on one side of the display area, the display panel comprising:
a substrate comprising a bearing surface;
a first conductive pad disposed on the bearing surface of the substrate, and the first conductive pad locating at the display area;
a second conductive pad disposed on the bearing surface of the substrate, and the second conductive pad disposed at the pad area;
a driving chip bonding to the pad area, and the driving chip comprising:
a first pin arranged corresponding to the first conductive pad; and
a second pin arranged corresponding to the second conductive pad;
a first conductive adhesive layer located between the first conductive pad and the first pin and being electrically connected to the first conductive pad and the first pin; and
a second conductive adhesive layer located between the second conductive pad and the second pin and being electrically connected to the second conductive pad and the second pin;

wherein a distance from a surface of the first conductive adhesive layer close to the first pin to the substrate is different from a distance from a surface of the second conductive adhesive layer close to the second pin to the substrate; and wherein the first conductive pad comprises a first bonding surface, the first bonding surface is at least partially parallel to the bearing surface and in contact with the first conductive adhesive layer, the second conductive pad comprises a second bonding surface, the second bonding surface is at least partially parallel to the bearing surface and in contact with the second conductive adhesive layer, and a distance between at least part of the first bonding surface parallel to the bearing surface to the substrate is different from a distance between at least part of the second bonding surface parallel to the bearing surface to the substrate.

20. A display panel, wherein the display panel comprises a display area and a pad area, and the pad area is disposed on one side of the display area, the display panel comprising:
    a substrate comprising a bearing surface;
    a first conductive pad disposed on the bearing surface of the substrate, and the first conductive pad is located at the pad area;
    a second conductive pad disposed on the bearing surface of the substrate, and the second conductive pad is located at the pad area; and
    a driving chip bonded to the pad area, and the driving chip comprising:
    a first pin disposed corresponding to the first conductive pad;
    a second pin disposed corresponding to the second conductive pad;
    a first conductive adhesive layer filled between the first conductive pad and the first pin and electrically connected to the first conductive pad and the first pin; and
    a second conductive adhesive layer filled between the second conductive pad and the second pin and being electrically connected to the second conductive pad and the second pin;
    wherein a distance from a surface of the first conductive adhesive layer close to the first pin to the substrate is different from a distance from a surface of the second conductive adhesive layer close to the second pin to the substrate; and
    wherein the first pins and the second pins are plurality, and the plurality of first pins and the plurality of second pins are disposed on the side of the driving chip away from the display area, the drive chip further comprises a plurality of redundant pins disposed close to the display area, and the plurality of the second pins are on a side of the plurality of the first pins away from the plurality of redundant pins in a direction of the display area pointing toward the pad area and at least part of the plurality of first pins are disposed adjacent to the plurality of second pins; at least a part of the first pins are located on opposite sides of the plurality of redundant pins in a direction perpendicular to a direction of the display area pointing toward the pad area, and the plurality of the second pins are respectively located at opposite sides of the plurality of the redundant pins.

* * * * *